US006836119B2

(12) United States Patent
DeMeester et al.

(10) Patent No.: US 6,836,119 B2
(45) Date of Patent: Dec. 28, 2004

(54) METHOD AND APPARATUS FOR ALIGNING A MAGNETIC FIELD MODIFYING STRUCTURE IN A MAGNETIC RESONANCE IMAGING SCANNER

(75) Inventors: Gordon D. DeMeester, Wickliffe, OH (US); Michael A. Morich, Mentor, OH (US); John V. M. McGinley, London (GB); Gerardus B. J. Mulder, Best (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/271,136

(22) Filed: Oct. 15, 2002

(65) Prior Publication Data

US 2004/0070396 A1 Apr. 15, 2004

(51) Int. Cl.[7] .............................................. G01V 3/00
(52) U.S. Cl. ...................................... 324/320; 324/309
(58) Field of Search ........................ 324/300, 307–309, 324/318, 320; 335/296, 298

(56) References Cited

U.S. PATENT DOCUMENTS

| 4,581,580 A | * | 4/1986 | Keim ........................... 324/318 |
| 4,812,797 A | * | 3/1989 | Jayakumar ................... 335/299 |
| 4,983,922 A | * | 1/1991 | Tahara ......................... 324/320 |
| 5,045,794 A | * | 9/1991 | Dorri et al. ................... 324/320 |
| 5,235,284 A | * | 8/1993 | Tahara et al. ................. 324/320 |
| 5,418,462 A | | 5/1995 | Breneman et al. ........... 324/320 |
| 5,532,597 A | | 7/1996 | McGinley et al. ........... 324/319 |
| 5,550,472 A | | 8/1996 | Richard et al. .............. 324/320 |
| 5,635,839 A | | 6/1997 | Srivastava et al. ........... 324/320 |
| 5,677,854 A | * | 10/1997 | Dorri ............................. 703/5 |
| 5,923,235 A | * | 7/1999 | Van Oort ..................... 335/301 |
| 5,992,006 A | | 11/1999 | Datsikas ........................ 29/607 |
| 6,181,137 B1 | * | 1/2001 | Havens et al. ............... 324/320 |
| 6,218,839 B1 | * | 4/2001 | Shaikh et al. ................ 324/320 |
| 6,255,928 B1 | * | 7/2001 | van Oort et al. ............. 335/301 |
| 6,275,129 B1 | * | 8/2001 | van Oort ..................... 335/301 |
| 6,294,972 B1 | * | 9/2001 | Jesmanowicz et al. ...... 335/301 |
| 6,313,634 B1 | | 11/2001 | Kasten ......................... 324/320 |
| 6,335,670 B1 | * | 1/2002 | Kinanen ....................... 335/296 |
| 6,529,005 B1 | | 3/2003 | Kasten et al. ................ 324/320 |
| 2002/0097122 A1 | * | 7/2002 | Rapoport ..................... 335/304 |
| 2002/0167320 A1 | * | 11/2002 | Sato ............................. 324/318 |
| 2003/0011456 A1 | * | 1/2003 | Yoshida et al. .............. 335/299 |
| 2003/0079334 A1 | * | 5/2003 | Xu et al. ........................ 29/607 |

FOREIGN PATENT DOCUMENTS

EP 374377 A2 6/1990

OTHER PUBLICATIONS

Souza, et al., "Optimal Design of a Self–Shielded Magnetic Resonance Imaging Magnet", Journal De Physique III, vol. 3, 1993, pp. 2121–2132 XP000409328 ISSN: 1155–4320.
DeMeester, et al. "Challenges of Short Magnet Design", Mag. Res. Materials in Physics, Biology and Medicine 13 (2002) 193–198.
Roméo et al. "Magnet Field Profiling: Analysis and Correcting Coil Design" Magnetic Resonance in Medicine 1, 44–65 (1984).

* cited by examiner

*Primary Examiner*—Brij Shrivastav
*Assistant Examiner*—Dixomara Vargas
(74) *Attorney, Agent, or Firm*—Fay, Sharpe, Fagan, Minnich & McKee, LLP

(57) ABSTRACT

In a method for aligning a magnetic field-modifying structure (74) in a magnet bore (12) of a magnetic resonance imaging scanner (8), a reference magnetic field map of the magnet bore (12) is measured without the magnetic field-modifying structure (74) inserted. The magnetic field-modifying structure (74) is inserted into the magnet bore (12). A second magnetic field map of the magnet bore (12) is measured with the magnetic field-modifying structure (74) inserted. At least one odd harmonic component of the first and second magnetic field maps is extracted. The magnetic field-modifying structure (74) is aligned in the magnet bore (12) based on a comparison of the odd harmonic component of the first and second magnetic field maps.

21 Claims, 6 Drawing Sheets

METHOD AND APPARATUS FOR ALIGNING A MAGNETIC FIELD MODIFYING STRUCTURE IN A MAGNETIC RESONANCE IMAGING SCANNER

BACKGROUND OF THE INVENTION

The following relates to the magnetic resonance imaging (MRI) arts. It particularly relates to a short bore horizontal magnet for an MRI scanner, and will be described with particular reference thereto. However, the following also relates to other MRI scanner magnets such as long bore magnets, open magnets, and vertical magnets, and to magnets of various types for applications both inside and outside the magnetic resonance imaging arts.

In a typical MRI scanner, a cylindrical bore electromagnet is arranged to receive a subject such as a patient, or any item which exhibits magnetic resonance properties, within the magnet bore. For medical imaging, the electromagnet is arranged with the cylindrical axis oriented horizontally to readily accommodate a patient arranged in a prone or supine position on a horizontal patient support. However, MRI scanners that employ electromagnets of other geometries such as "open" magnets are also known.

In the past, long-bore cylindrical electromagnets with a plurality of axially spaced annular windings have been employed to achieve a large, highly uniform magnetic field oriented along the cylindrical axis. However, such magnets are large and inhibit patient access. Additionally, in medical imaging it has been found that claustrophobic or nervous patients are often intimidated by being placed in a long-bore electromagnet. Hence, there is a demand for shorter bore magnets for MRI scanners.

However, as the magnet bore is shortened, magnetic field uniformity can suffer. In particular, an imaging volume within the magnet bore which has a uniform enough magnetic field for imaging is reduced as the magnet bore is shortened. There is also a demand for high magnetic fields, which exasperates the problem of producing a large uniform field region in a compact magnet because of increased conductor requirements and larger coils. A large main magnetic field can be desirable since the magnetic resonance signal is proportional to field strength. This signal advantage can be used in a variety of ways such as to obtain high spatial resolution, rapid data acquisition rates, and other imaging benefits.

To a certain extent, magnetic field nonuniformities can be corrected using steel shims. Specifically, by adding selected, variable amounts of steel at selected locations in the magnetic field produced by the magnet, the field can be shaped to improve field uniformity. Such shimming is typically performed to compensate for manufacturing variations. That is, the shims are added during calibration to correct for manufacturing imperfections, and are typically not part of the magnet design. Shim corrections are effective for magnetic field variations that are characterized as lower order harmonic field components, but are less effective in correcting or modifying higher order magnetic field components due to a need for substantial amounts of steel to effect higher order corrections.

To further improve field uniformity and strength, electromagnets have been designed in conjunction with a steel structure, assembly, array or the like which interacts with the magnet field to define a larger imaging volume. The steel structure is incorporated into the magnet design, rather than being used to correct manufacturing imperfections.

However, a problem arises in magnets that incorporate a field shaping arrangement of ferromagnetic material. Specifically, the steel structure must be very precisely aligned within the magnet to achieve optimal field uniformity. Relative misalignment of as little as one millimeter (about 0.1% for a 1-meter magnet bore) can produce substantial magnetic field nonuniformities. Misalignment of the steel structure in the axial direction of the magnet is particularly problematic.

The present invention contemplates an improved apparatus and method that overcomes the aforementioned limitations and others.

BRIEF SUMMARY OF THE INVENTION

According to one aspect, a method is provided for aligning a magnetic field-modifying structure in a magnet bore defined by a main magnet of a magnetic resonance imaging scanner. The magnetic field-modifying structure is inserted into the magnet bore. Subsequent to the inserting, a value is measured of one of: (i) an odd harmonic component of a field cooperatively produced by the main magnet and the magnetic field-modifying structure, and (ii) a force exerted on the magnetic field-modifying structure by a field produced by the main magnet. A position of the magnetic field-modifying structure in the magnet bore is adjusted to minimize the measured value.

According to another aspect, an apparatus is disclosed for aligning a magnetic field-modifying structure in a magnet bore defined by a main magnet of a magnetic resonance imaging scanner. A field measuring means is provided for measuring a value of one of: (i) an odd harmonic component of a field cooperatively produced by the main magnet and the magnetic field-modifying structure, and (ii) a force exerted on the magnetic field-modifying structure by a field produced by the main magnet. A means is provided for indicating a position adjustment to the magnetic field-modifying structure in the magnet bore to minimize the measured value.

According to yet another aspect, a magnetic resonance imaging apparatus is disclosed, including a main magnet that defines a generally cylindrical magnet bore. A magnetic field-modifying structure is configured to modify at least one even harmonic component of a magnetic field produced by the main magnet. The magnetic field-modifying structure is aligned in the magnet bore by minimizing at least one odd harmonic component of the magnetic field.

One advantage resides in providing very precise alignment of a ferromagnetic structure, another electromagnet, or other magnetic structure, assembly, array or the like within an MRI scanner magnet bore.

Another advantage resides in enhanced magnetic field uniformity and homogeneity.

Another advantage resides in enhanced safety and speed of the alignment process.

Yet another advantage resides in aligning a steel structure with respect to a magnetic field component that is closely associated with the magnetic field component which the steel structure is intended to modify.

Numerous additional advantages and benefits will become apparent to those of ordinary skill in the art upon reading the following detailed description of the preferred embodiments.

BRIEF DESCRIPTION OF THE DRAWINGS

The invention may take form in various components and arrangements of components, and in various process operations and arrangements of process operations. The drawings are only for the purpose of illustrating preferred embodiments and are not to be construed as limiting the invention.

DETAILED DESCRIPTION OF THE PREFERRED EMBODIMENTS

Figure 1:
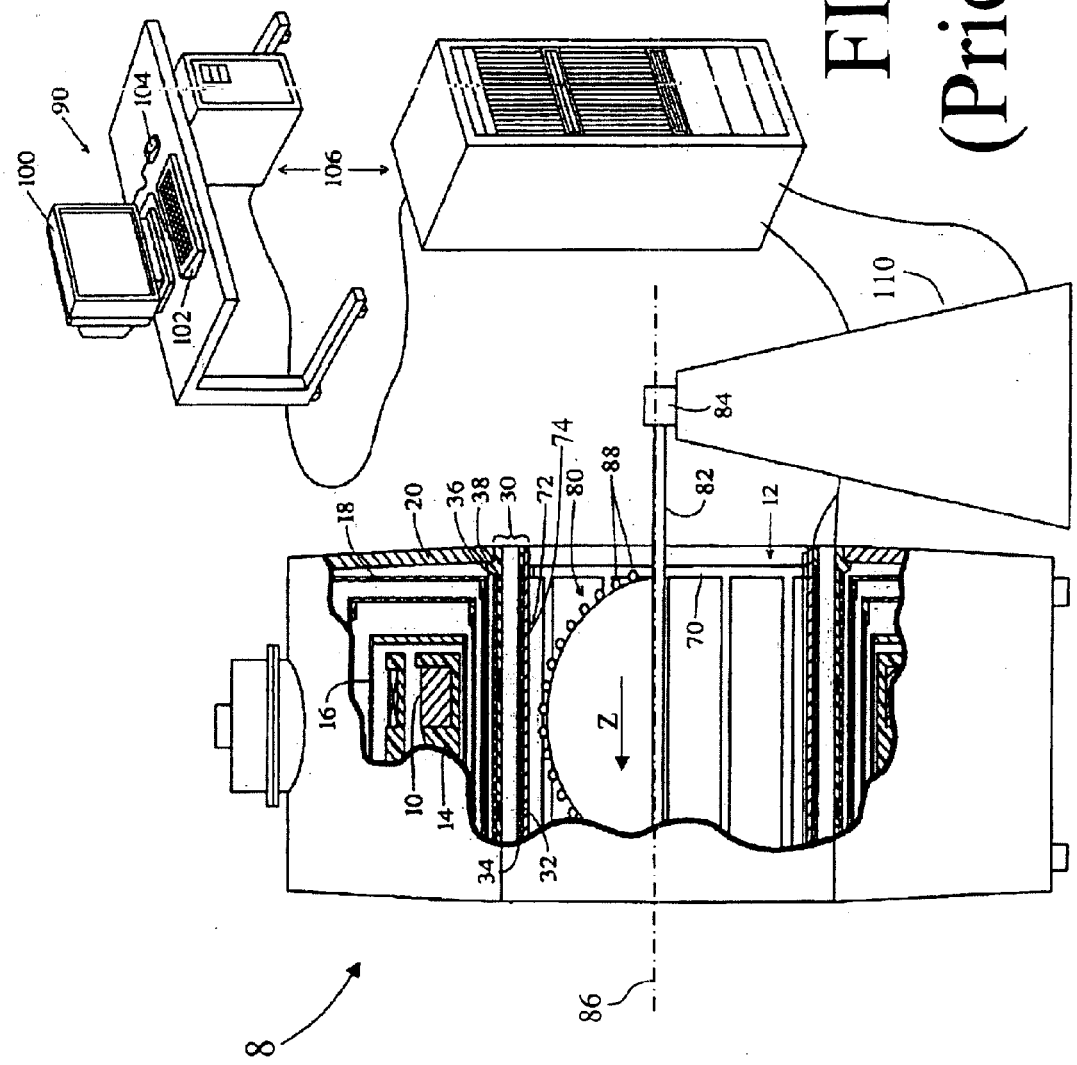
FIG. 1 is a diagrammatic illustration of a magnetic resonance imaging system including a magnetic field-modifying structure and a probe for measuring magnetic field.
Figure 2:
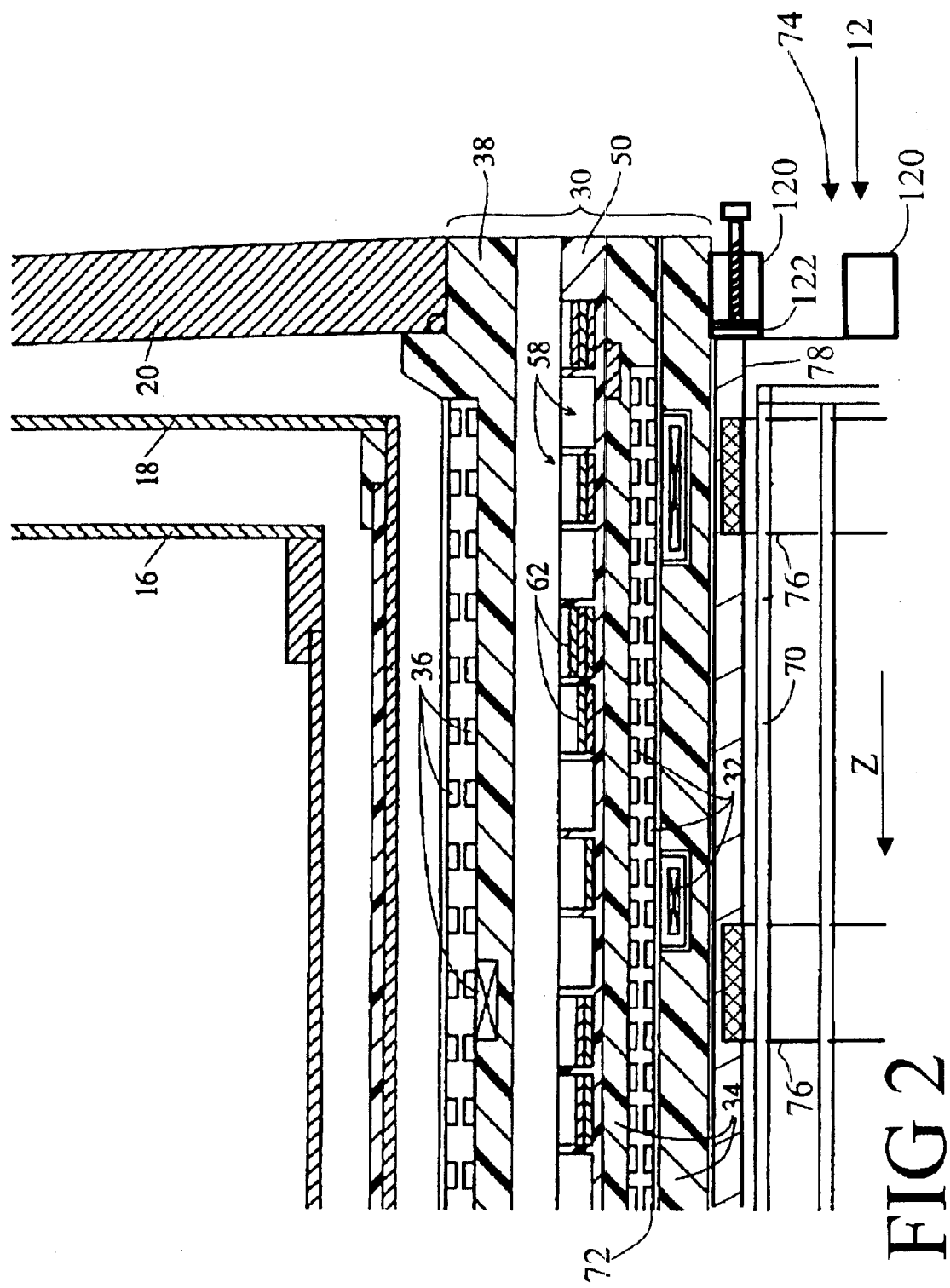
FIG. 2 is a detailed cross-sectional view of a portion of the magnet bore region of the magnetic resonance imaging scanner of FIG. 1 which illustrates the arrangement of gradient coils, RF coils, and the magnetic field-modifying structure.

With reference to FIGS. 1 and 2, a magnetic resonance imaging scanner 8 has a main magnet which includes primary coils 10 that generate a temporally constant main magnetic field within a magnet bore 12. Within an imaging region generally located at a geometric center of the bore 12, the magnetic field generated by the main magnet is substantially uniform within selected tolerances and extends axially along a longitudinal or Z-direction. Coordinate x- and y-directions (not labeled) that are orthogonal to the Z-direction define a conventional Cartesian coordinate system. An imaging subject such as a medical patient, or any item that exhibits magnetic resonance properties, in the bore 12. In a preferred short bore embodiment, the bore 12 has a length along the axial or Z-direction of less than 1.7 meters, and typically about 1.5 meters. However, an intermediate or a long bore magnet, such as a magnet with an axial length of about 1.7 meters or longer, can also be used.

The primary coils 10 are supported by a former 14 that is received in a toroidal helium vessel or can 16. The helium vessel 16 is filled with liquid helium to maintain the primary magnet coils 10 at superconducting temperatures. The can is surrounded by one or more cold shields 18 that are supported in a vacuum dewar 20. Although a superconducting main magnet is described herein, a resistive main magnet is also contemplated.

A whole body gradient coil assembly 30 includes x-, y-, and z-gradient coils mounted around the bore 12. In a preferred embodiment, the gradient coil assembly is a self-shielded gradient coil assembly that includes primary x-, y-, and z-gradient coil assemblies 32 potted in a dielectric former 34, and a secondary or shield gradient coil assembly 36 that is supported on an outer cylindrical surface or wall 38 of the vacuum dewar 20. The dielectric former 34 with the potted primary gradient coils 32 functions as a bore liner. Alternatively, a cosmetic bore liner is included.

Preferably, a plurality of dielectric trays 50 peripherally arranged around the bore 12 define pockets 58 that each receive a variable number of thin ferrous shims 62. The number and distribution of the shims 62 is selected to correct the temporally constant main magnetic field for non-uniformities caused by manufacturing imperfections in the main magnet. The shims 62 can also be used to correct lower order magnetic field non-uniformities inherent in the main magnet design. However, the size and location of the shims 62 makes it difficult to substantially correct higher order magnetic field terms by shimming.

A radio frequency coil 70 is mounted inside the primary gradient coil 32. The illustrated coil 70 is a birdcage coil extending substantially along the entire length of the bore 12. Optionally, smaller transmit and/or receive coils or coil arrays are included (not shown). A radio frequency shield 72, such as a layer of copper mesh, is mounted between the radio frequency coil 70 and the primary gradient coil 32.

The main magnet is further designed to incorporate a magnetic field-modifying structure 74 which in the illustrated embodiment includes a plurality of steel rings 76 mounted on a dielectric former 78 shaped to slidably fit into the magnet bore 12. The steel rings 76 can be in the form of iron or steel bands, segmented or laminated bands, platelets, pellets, powder encased in resin, or the like. The magnetic field-modifying structure 74 is adjustably retained in the magnet bore 12. When properly aligned, the main magnet produces a magnetic field that is inductively modified by the steel 76 of the magnetic field-modifying structure 74, and the main magnet and the magnetic field-modifying structure 74 cooperatively produce a substantially spatially uniform magnetic field.

More specifically, the magnetic field-modifying structure 74 is configured to modify one or more even higher order magnetic field harmonics, such as the Z10 and/or the Z12 spherical zonal harmonic. The magnetic field-modifying structure 74 is positioned symmetrically in the main magnet. The size, number, and placements of the steel rings 76 is dictated by the harmonics to be corrected. In this symmetrically aligned position, the magnetic field including inductive modifications of the magnetic field-modifying structure 74 has greatly reduced (ideally zero magnitude) odd zonal harmonics.

However, a slight misalignment of the magnetic field-modifying structure 74 relative to the main magnet produces substantial errors in the value of the modified harmonics, for example the Z10 zonal harmonic. Moreover, such misalignment produces odd harmonics of increased magnitude, especially for odd harmonics with index values numerically adjacent to or interleaving the targeted even harmonics. For the exemplary magnetic field-modifying structure 74 which is designed to modify the Z10 even harmonic, typically the adjacent odd harmonics Z9 and Z11 are most strongly affected by a misalignment.

With continuing reference to FIGS. 1 and 2, a magnetic field mapping sensor array 80 includes a central shaft 82 which is securely but removably mounted via a rotating support 84 along a central axis 86 of the magnet bore 12. The rotating support 84 includes a stepping motor or other mechanism for selectively rotating the central shaft 82, for example in 10° to 12° angular increments. The central shaft 82 carries a plurality of magnetic field probes or sensors 88. The sensor or sensors 88 are positioned at selected locations to sample a set of spherical harmonics. A spherical sampling volume is preferred to simplify the use of spherical coordinates for field error calculations. The magnetic field sensors 88 provide a magnetic field map of the magnetic field in the bore with the main magnet operating.

A user interface 90 includes a human-readable display 100 such as a video monitor, which is preferably graphical, and one or more user input devices such as a keyboard 102 and a mouse 104. One or more electronics racks 106 hold a magnetic resonance sequence controller, data storage units, a reconstruction processor, radio frequency transmitter and receiver electronics, and the like that are arranged and interconnected to perform various types of magnetic resonance imaging such as echo-planar imaging, spin-echo imaging, and the like.

Optionally, the electronics racks 106 also hold electronics that receive and process magnetic field sampling data from the magnetic field mapping device 80. For ease of use, however, the magnetic field mapping device 80 preferably includes an integral electronics processor 110 that computes spherical magnetic field harmonic components such as the Z9, Z10, and Z11 harmonic components from the discrete magnetic field measurements of the sensors 88.

The computed harmonic components are received and displayed by the user interface 90 to allow a user to optimize alignment of the magnetic field-modifying structure 74 in the magnet bore 12. Typically, misalignment of the magnetic field-modifying structure 74 in the axial or Z-direction has about an order of magnitude larger effect on the magnetic field harmonics compared with misalignment in the x- or y-directions. However, skewing misalignment still causes non-uniformities to be corrected in one embodiment.

The magnetic field-modifying structure 74 is constructed as a rigid structure with the x- and y-directional alignment defined by a close-tolerance fit of the former 78 in the magnet bore 12. An axial or Z-directional alignment is achieved by sliding adjustment of an axial position of the magnetic field-modifying structure 74 in the magnet bore 12. The user optimizes the axial alignment to minimize one or more selected odd magnetic field harmonic components.

The magnetic resonance imaging system, magnetic field-modifying structure 74, and alignment hardware 120 are exemplary only. Suitable alignment hardware includes an array of end stops 120 which are adjustably attached to the bore 12 at opposite ends of the dielectric former 78. The stops 120 optionally includes camming surfaces, such as by advancing a threaded element. By advancing or retracting the camming surface or stops differentially around the bore 12, canting or skewing adjustments can be made.

Those skilled in the art can suitably adapt the illustrated system for specific imaging scanners, field-modifying structures, and available magnetic field probes. For example, the multi-sensor magnetic field mapping device 80 can be replaced by a manually operated discrete magnetic field sensor which the user applies to map out the magnetic field. The optimized odd harmonics are preferably selected to be numerically adjacent to the even harmonics which the field-modifying structure is designed to modify, since these odd harmonics are typically most sensitive to misalignment. Instead of a magnetic field sensor, force transducers 122 arranged in the end stops 120 can be used to measure magnetic field forces on the magnetic field-modifying structure 74.

Figure 3:
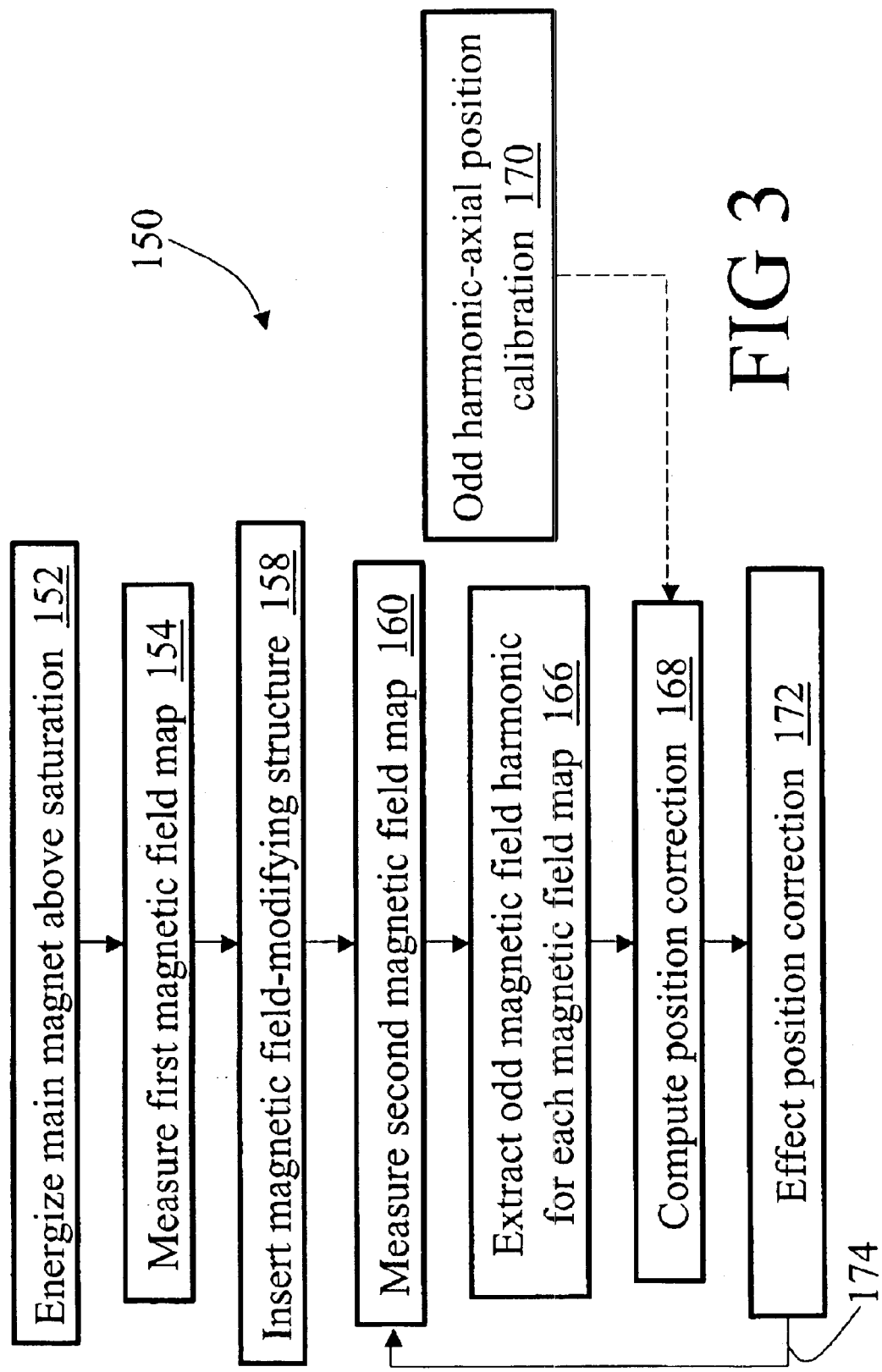
FIG. 3 illustrates a first method for aligning the magnetic field-modifying structure in the magnet bore which uses an applied magnetic field and a quantitative calculation of the correction adjustment.

With continuing reference to FIGS. 1 and 2, and with further reference to FIG. 3, a suitable method 150 for aligning the magnetic field-modifying structure 74 in the magnet bore 12 is described. The main magnet is energized 152 to produce a main magnetic field in the magnet bore 12. The main magnetic field is stabilized at a sufficiently high level to magnetically saturate the steel material of the steel rings 76.

Magnetic resonance imaging typically occurs at fields of around 0.5 tesla or higher. These imaging fields are above the saturation field strength of the steel rings 76. However, since the spatial geometric configuration of the main magnetic field is substantially independent of the field strength for fields above the saturation field strength of the steel rings 76, the shims 62, and other magnetic material in the magnetic field, the alignment process 150 can be performed at a lower field strength than a typical imaging field strength, as long as the field is above saturation respective to the steel rings 76 and other magnetic materials residing in the field. Alignment at lower fields advantageously reduces field ramp and stabilization times, and promotes safety.

The magnetic field sensors 88 are used to measure 154 a reference magnetic field map. The magnetic field-modifying structure 74 is inserted 158 into the magnet bore 12, and a second magnetic field map is measured 160 with the magnetic field-modifying structure 74 inserted. The reference field map and the second field map are each analyzed to extract 166 one or more odd-order magnetic field harmonic components, such as the Z9 and Z11 odd harmonic components.

In a suitable sequence, the magnetic field mapping device 80 is centered in the main magnet. The centering can be done by aligning the magnetic probe 80 in the main magnet, or by correcting the magnetic field map. Probe alignment is suitably performed with reference to the odd magnetic field harmonics. After the magnetic probe 80 is centered, the magnetic field map with the magnetic field-modifying structure 74 in place is acquired. The relative shift between the first and second magnetic field maps indicates the misalignment since the position of the main magnet with respect to the magnetic field probe 80 is already centered.

In a preferred embodiment, this extraction 166 is performed by decomposing each magnetic field map into spherical zonal harmonic components Z1, Z2, Z3, Z4, Z5, et cetera. The extraction 166 selects one, two, or a few odd harmonic components which are most sensitive to misalignment. Typically, the most sensitive odd harmonic components are those which are indexed adjacent to or interleaving an index or indices of one or more even harmonic components which the magnetic field-modifying structure 74 is designed to modify. For example, a structure that modifies the Z10 and Z12 even harmonics typically will show misalignment as substantial deviations from zero magnitude for the adjacent Z9 and Z13 odd harmonics, and for the interleaving Z11 odd harmonic.

A correction adjustment is computed 168 based on the extracted odd harmonic component or components of the reference and second magnetic field maps. By comparing the measured harmonic components with prior measurements in similar scanners and the previously determined adjustment distance previously needed for correction, an estimate of the physical displacement needed to correct the currently measured harmonic components can be made. Because of the cylindrical symmetry of the main magnet, the odd harmonic components are ideally zero. Similarly, the magnetic field-modifying structure 74 is designed to be magnetically spherically symmetrical. Thus, the magnetic field-modifying structure 74 when accurately inserted relative to the symmetry of the main magnet should have no effect on the cylindrical symmetry of the main magnetic field, and so the odd harmonic components should ideally remain at zero after accurate insertion.

In practice, the main magnet typically includes manufacturing imperfections which produce non-zero odd harmonic components. Optimal selection and placement of the shims 62 reduces but typically does not eliminate the effect of the manufacturing imperfections on the main magnetic field. Thus, a real magnet typically has odd harmonic components with magnitudes close to, but not exactly, zero. Typically, the higher order odd harmonic components are closer to zero than are lower order odd harmonics.

Moreover, the insertion 158 includes aligning the magnetic field-modifying structure 74 with reference to fiduciary marks or other visually perceived structural references. The magnetic field-modifying structure 74 is therefore typically misaligned, for example by around one or a few millimeters in the axial direction. Such axial misalignment has a substantial effect on odd harmonic components, particularly those with indices adjacent to or interleaving indices of even harmonic components which the magnetic field-modifying structure 74 is designed to modify. That is, misalignment particularly affects the odd harmonic component or components that were extracted 166 from the magnetic field maps.

Figure 4:
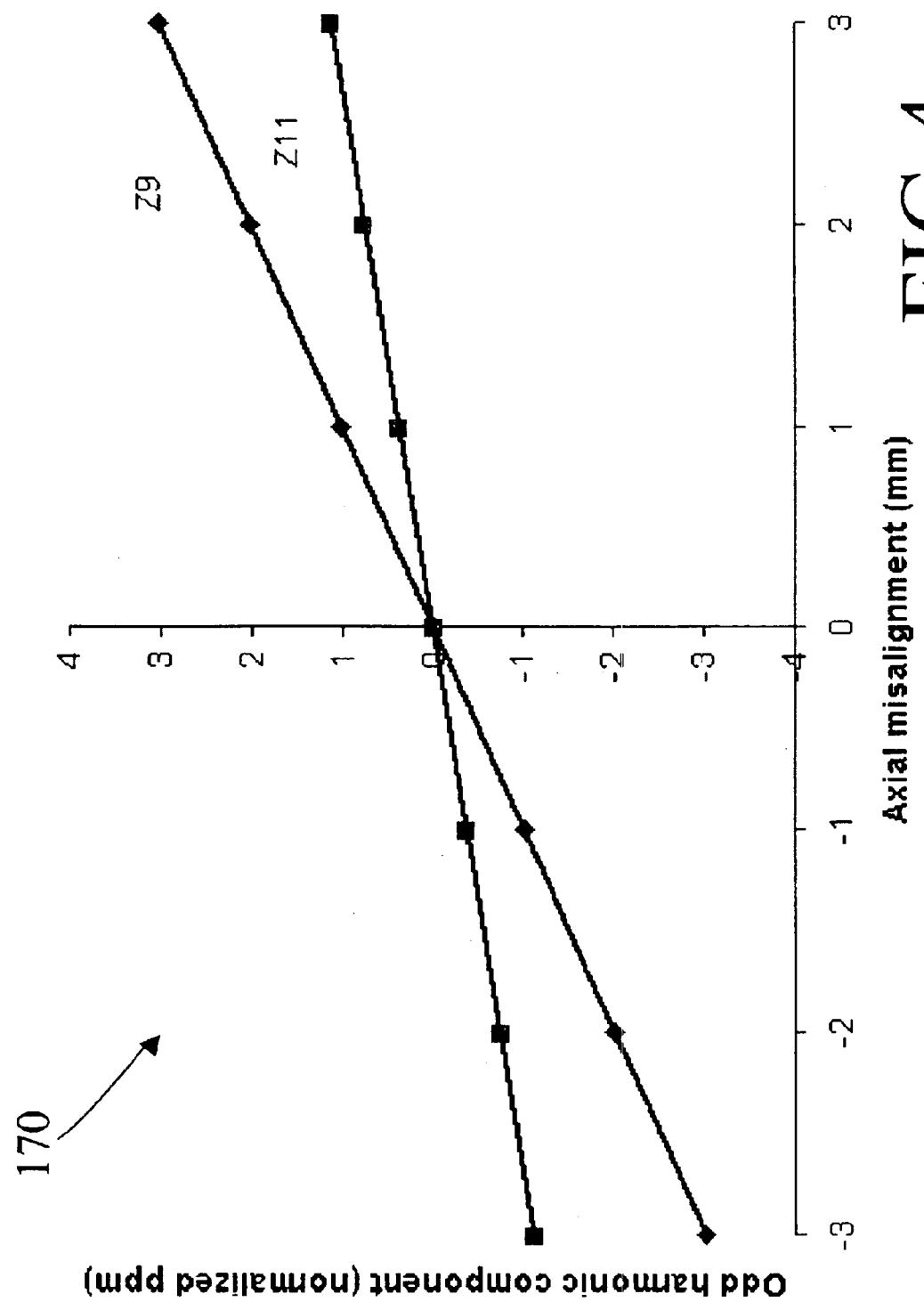
FIG. 4 shows an exemplary calibration of the Z9 and Z11 odd harmonic components for a magnetic field-modifying structure designed to modify the Z10 even harmonic component of the magnetic field.

Additionally, with continuing reference to FIG. 3 and with further reference to FIG. 4, for relatively small axial misalignments of a few millimeters the misalignment has a generally linear effect on the odd order harmonic components near the even harmonic the structure 74 is designed to modify. A calibration 170 relating one or more odd harmonics with the axial misalignment is used in the computing 168 of the correction adjustment. FIG. 4 shows an exemplary calibration 170 for a main magnet designed to incorporate a magnetic field-modifying structure that modifies the Z10 even harmonic magnetic field component.

Specifically, in FIG. 4 the Z9 and Z11 odd harmonic components adjacent to the Z10 harmonic are plotted in normalized parts-per-million (ppm) units against axial misalignment in millimeters (mm). A substantial linear deviation in the Z9 and Z11 component magnitudes is seen. Moreover, the direction of misalignment (positive or negative) is indicated by the polarity of the Z9 and Z11 components.

FIG. 4 shows a computed calibration 170 based on design parameters for a main magnet which is designed to incorporate the corresponding magnetic field-modifying structure. Hence, the ideal situation is shown in which the components Z9 and Z11 are zero for perfect alignment. In practice the main magnet has its own harmonic component values due to manufacturing imperfections, which are extracted 166 from the reference magnetic field map measured 154 without the magnetic field-modifying structure 74 inserted.

The axial correction computation 168 preferably accounts for the main magnet imperfections by taking a difference between the odd harmonic component extracted from the measurement 160 and the reference odd harmonic component extracted from the measurement 154. The difference value is input to the calibration 170 to compute a suitable axial position correction.

However, if the main magnet is known or expected to have a small odd harmonic component, for example based on measurements performed during the shimming, then the reference field measurement 154 is optionally omitted and the difference value assumed to be equal to the value of the odd harmonic component extracted from the measurement 160 with the magnetic field-modifying structure 74 inserted. (In other words, the reference odd harmonic component value is estimated to be equal to zero).

The computed axial position correction is effected 172 by a suitable axial movement of the magnetic field-modifying structure 74 within the magnet bore 12. Optionally, the process operations are repeated 174 to acquire 160 an update magnetic field map and extract 162 an update odd harmonic component value to verify proper alignment and, if needed, to compute 168 and effect 170 one or more additional axial alignment corrections.

The method 150 shown in FIG. 3 is performed with the main magnet energized 152 above a level sufficient to saturate the steel 76 of the magnetic field-modifying structure 74. In such a saturation state, the main magnetic field in the magnet bore 12 has a geometric configuration that is substantially the same as the main magnetic field at imaging strength.

Figure 5:
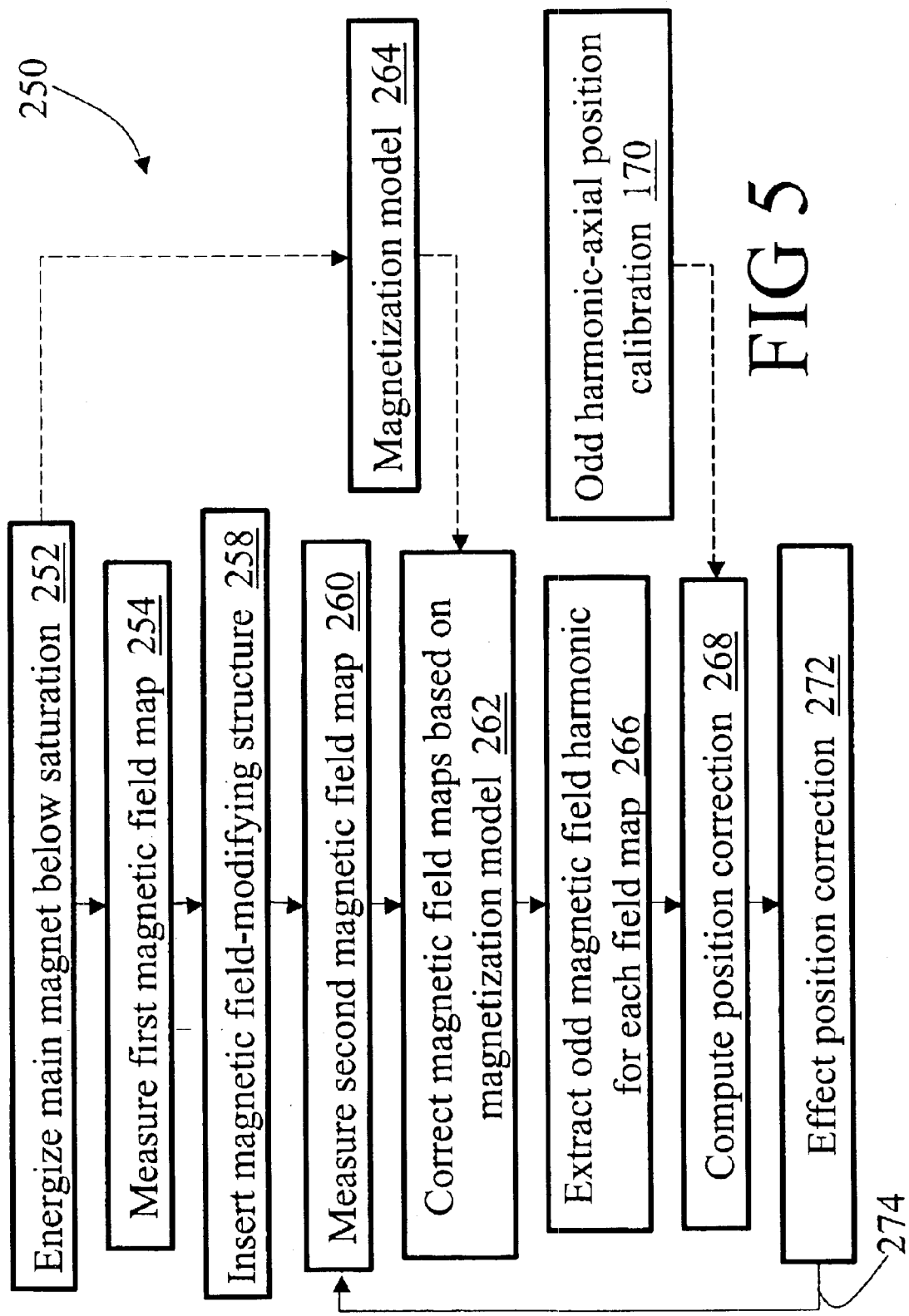
FIG. 5 illustrates a second method for aligning the magnetic field-modifying structure in the magnet bore which uses an applied magnetic field and a quantitative calculation of the correction adjustment.

With reference to FIG. 5, a method 250 is similar to the method 150 of FIG. 3, except that the method 250 is performed with the main magnet energized 252 at a level below that necessary to saturate the steel 76. Thus, the method 250 further reduces alignment time and increases safety by using an even lower magnetic field strength. A reference magnetic field map is measured 254, the magnetic field-modifying structure 74 is inserted 258 into the magnet bore 12, and a second magnetic field map is measured 260. These steps correspond to analogous steps of the method 150.

In the method 250 of FIG. 5, the magnetic field maps acquired in the measurements 254, 260 are corrected or adjusted 262 based on a suitable magnetization model 264 of the steel 76 of the magnetic field-modifying structure 74. Preferably, the magnetization model 264 also accounts for other magnetic materials within the magnetic field such as the shims 62. The field map corrections 262 adjust for differences in geometric configuration of the main magnetic field below and above saturation.

The corrected magnetic field maps are then processed analogously to the method 150. Specifically, the selected odd harmonic components are extracted 266, a position correction is computed 268 based on the calibration 170, and the correction is effected 272. optionally, the process operations 260, 262, 266, 268, 272 are repeated 274 after the first adjustment to verify and if needed further refine the axial alignment.

The methods 150, 250 of FIGS. 3 and 5 employ the calibration 170 to compute a quantitative axial position adjustment. However, in some circumstances the calibration 170 may be unavailable, for example if the magnetic field-modifying structure is a retrofit rather than a component incorporated into the design of the main magnet. Moreover, if manufacturing imperfections are such that the main magnet includes relatively large odd harmonic component values, quantitative computation of the axial position adjustment may be imprecise, and the benefit of quantitative calculation may be minimal.

Figure 6:
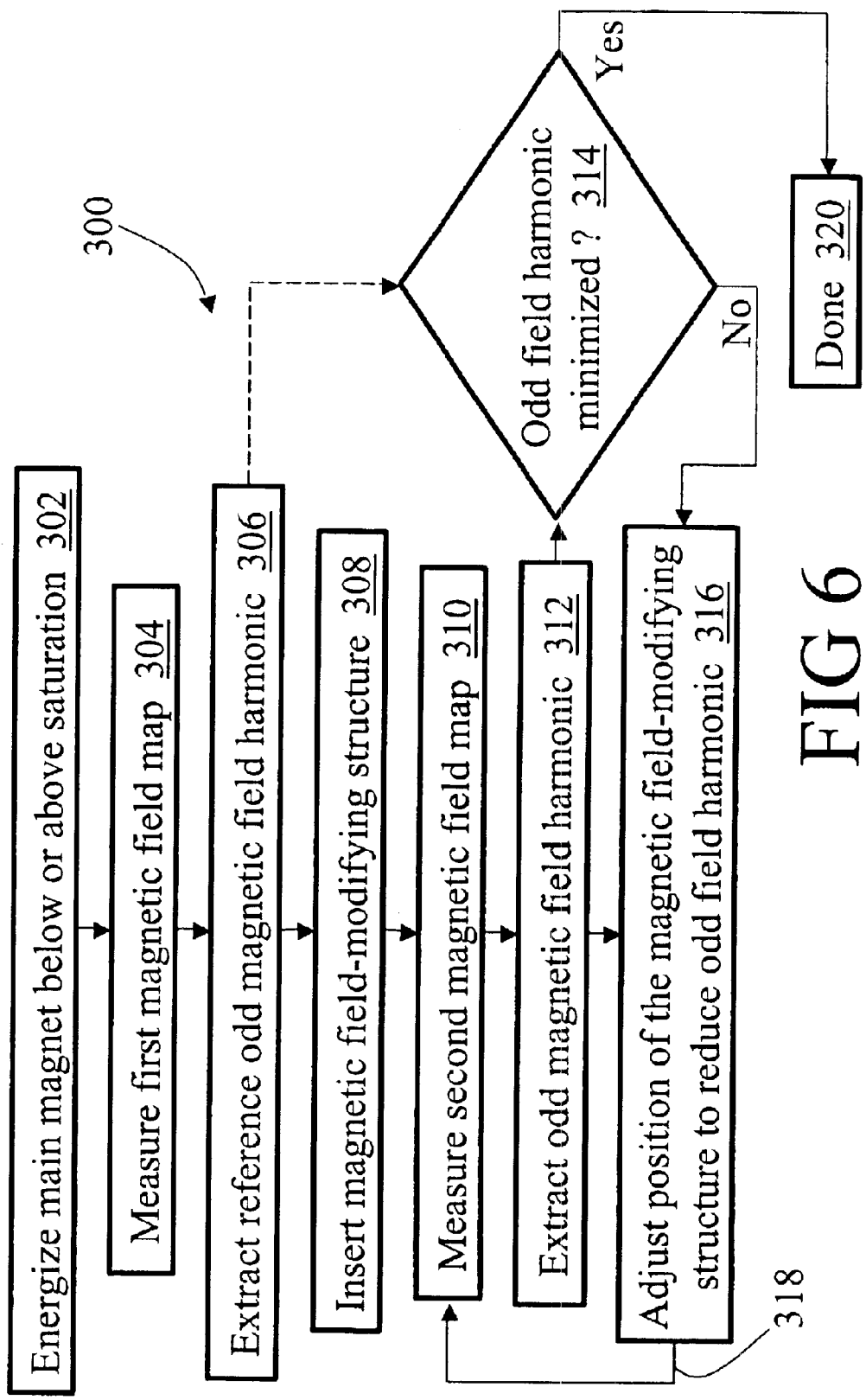
FIG. 6 shows a third method for aligning the magnetic field-modifying structure in the magnet bore which uses an applied magnetic field either above or below saturation of the steel and an iterative correction adjustment.

With reference to FIG. 6, another method 300 is described, which uses iterative axial position corrections to align the magnetic field-modifying structure 74 without reference to the calibration 170. The main magnet is energized 302 to produce a magnetic field. Since quantitative corrections are not computed in the method 300, either a magnetic field above saturation or a magnetic field below saturation can be used.

A reference magnetic field map is measured 304 and the selected one or more odd harmonic components are extracted 306. These values provide a baseline target for the subsequent alignment process operations. Optionally, if measurements performed during the shimming or other information indicates that the main magnet has relatively insignificant odd harmonic components, the reference magnetic field measurement 304 and odd harmonic component extraction 306 are optionally omitted, and a zero value is assumed for the reference odd harmonic component.

The magnetic field-modifying structure 74 is inserted 308 into the magnet bore 12, a second magnetic field map is measured 310 with the structure 74 in the magnet bore 12, and the selected one or more odd harmonic components are again extracted 312. Based on a comparison of the reference odd harmonic component and the odd harmonic component with the structure 74 inserted, a decision is made 314 as to whether an alignment correction should be performed.

If it is decided to perform a correction, a qualitative axial position adjustment is made 316 based on the comparison of the reference odd harmonic component and the odd harmonic component. A direction of the qualitative correction is selected based on the polarity of the odd harmonic component with the structure 74 inserted, and a magnitude of the qualitative correction is selected based on an absolute difference between the odd harmonic component with the structure 74 inserted and the reference odd harmonic component.

After the correction 316, the process is repeated 318. Specifically, an update magnetic field map is measured 310, the odd harmonic component is extracted 312 from the update magnetic field map and compared 314 with the reference odd harmonic component value. Optimization is complete 320 when it is decided 314 that the update odd harmonic value is minimized, as indicated by a substantial lack of improvement between iterations 318, and/or by the odd harmonic value being reduced to about the reference odd harmonic value.

The invention has been described with reference to an axial alignment performed using the magnetic mapping device 80. However, the described embodiments are readily adapted to perform alignment in the x- or y-direction, or to correct a skew or other angular misalignment of a magnetic field-modifying structure arranged in the magnet bore. Moreover, the methods described herein are suitably applied to aligning magnetic materials arranged anywhere within the main magnetic field. For example, the methods are applicable to aligning steel placed within or outside the whole body gradient coil assembly 30.

Additionally, the magnetic field mapping device 80 can be replaced by other suitable magnetic field sensors or indicators. For example, a discrete manually operated magnetic field probe can be used to manually map out the magnetic field.

In an alternate embodiment, force transducers 122 communicate with the magnetic field-modifying structure to measure a force acting thereon. Since the magnitude and polarity of the magnetic force acting on the magnetic field-modifying structure correlates with axial misalignment, the force provides a measure of the odd harmonic component value and is suitably minimized. When the isocenter of the magnetic field-modifying structure 74 is aligned with the isocenter of the magnet, not only are the odd harmonics minimized but the forces pushing on the structure 74 are balanced. That is, the measured force is zero. As the isocenters diverge, the magnetic field pushes the magnetic field-modifying structure 74 further off center. The force measurement embodiment uses the above-discussed methods, but rather than determining the magnitude and polarity of the key odd magnetic field harmonics it determines the magnitude and direction of the force. The force measurement is preferably performed after low order magnetic field harmonics are shimmed away by selective placement of the shims 62.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method for aligning a magnetic field-modifying structure in addition to ferrous shims with a magnetic resonance imaging scanner, the method including:
   approximately axially positioning the magnetic field-modifying structure designed to modify at least one selected even harmonic of a magnetic field produced adjacent a cylindrical main magnet;
   subsequent to the approximate axial positioning, measuring a value of an odd harmonic component of the magnetic field produced by the cylindrical main magnet;
   correcting the axial position of the magnetic field-modifying structure respective to the cylindrical main magnet to minimize the measured value of the odd harmonic component of the magnetic field; and
   selectively adding or removing ferrous shims at discrete axial positions to shim the magnetic field.

2. The method as set forth in claim 1, wherein the magnetic field-modifying structure includes steel that inductively couples with the main magnet.

3. The method as set forth in claim 1, wherein the measuring includes:
   measuring a magnetic field produced by the main magnet; and
   decomposing the measured magnetic field into harmonic components, the value corresponding to an odd harmonic component of order greater than or equal to five.

4. The method as set forth in claim 1, wherein the measuring includes:
   energizing the main magnet to produce a magnetic field that is substantially lower than an operating magnetic field of the magnetic resonance imaging scanner;
   measuring the magnetic field; and
   decomposing the measured magnetic field into harmonic components.

5. The method as set forth in claim 1, wherein the selected even harmonic is of order greater than three, and the measuring includes:
   measuring an odd magnetic field harmonic with an order index that is numerically adjacent to the order index of the selected even harmonic.

6. A method for aligning a magnetic field-modifying structure with a magnet of a magnetic resonance imaging scanner which images at a preselected main-field strength, the method including:
   inserting the magnetic field-modifying structure into the magnet;
   subsequent to the inserting:
   (i) energizing the magnet, the energizing producing an alignment magnetic field that is less than the preselected main-field strength and less than a saturation magnetic field;
   (ii) measuring a magnetic field map of the alignment magnetic field;
   (iii) estimating a value of an odd harmonic component of the alignment magnetic field based on the measured magnetic field map;

(iv) adjusting a position of the magnetic field-modifying structure within the magnet respective to the magnet to minimize the value of the odd harmonic component measured at the alignment magnetic field; and increasing the magnetic field to the preselected main field strength, subsequent magnetic resonance imaging being performed by the magnetic resonance imaging scanner at the preselected magnetic field strength.

7. The method as set forth in claim 6, wherein the estimating of the value of the odd harmonic component based on the measured magnetic field map includes:

correcting the magnetic field map based on a magnetization model of the magnetic field-modifying structure.

8. The method as set forth in claim 1, wherein the measuring includes:

acquiring a magnetic field map; and decomposing the magnetic field map into spherical harmonic components.

9. The method as set forth in claim 1, wherein the correcting of the axial position of the magnetic field-modifying structure includes:

determining a calibration of the odd harmonic component with respect to axial misalignment of the magnetic field-modifying structure in the cylindrical main magnet; and axially moving the magnetic field-modifying structure an axial correction distance, the axial correction distance being based on the measured value of the odd harmonic component and the calibration.

10. The method as set forth in claim 9, further including:

prior to the approximate axial positioning, measuring a reference value of the odd harmonic component without the magnetic field-modifying structure positioned adjacent the cylindrical main magnet, the axial correction distance being further based on the reference value.

11. The method as set forth in claim 1, wherein the correcting of the axial position of the magnetic field-modifying structure includes:

(i) moving the magnetic field-modifying structure relative to the cylindrical main magnet;

(ii) subsequent to the moving, measuring an update value of the odd harmonic component with the magnetic field-modifying structure moved; and (iii) repeating the moving (i) and the measuring (ii) until the update value of the odd harmonic component is substantially equal to a target value.

12. The method as set forth in claim 11, wherein the target value is zero.

13. The method as set forth in claim 11, further including:

prior to the approximate axial positioning, measuring a reference value of the odd harmonic component without the magnetic field-modifying structure positioned adjacent the cylindrical main magnet, the target value being determined based on the reference value.

14. A magnetic resonance imaging scanner including: a main magnet for generating a magnetic field through an examination region, shims for adjusting the magnetic field, and a magnetic field modifying structure in addition to the shims for modifying the magnetic field, an apparatus for aligning the magnetic field-modifying structure with the main magnet, the apparatus further including: a field measuring means for measuring a value of an odd harmonic component of a magnetic field cooperatively produced by the main magnet and the magnetic field-modifying structure; and a means for adjusting a position of the magnetic field-modifying structure with respect to the main magnet to minimize the measured value of the odd harmonic component.

15. The apparatus as set forth in claim 14, wherein the magnetic field-modifying structure includes steel that inductively couples with the main magnet.

16. The apparatus as set forth in claim 14, wherein the field measuring means includes:

a means for measuring a magnetic field map of the magnetic field cooperatively produced by the main magnet and the magnetic field-modifying structure; and a means for extracting at least one odd harmonic component of the magnetic field map.

17. The apparatus as set forth in claim 16, wherein the means for measuring a magnetic field map includes one of:

a magnetic field probe that measures a magnetic field at a discrete position; and a multi-sensor magnetic field mapping device.

18. The apparatus as set forth in claim 17, wherein the means for extracting at least one odd harmonic component of the magnetic field map includes:

a spherical harmonics decomposition processor associated with the multi-sensor magnetic field mapping device.

19. The apparatus as set forth in claim 14, wherein the means for adjusting a position of the magnetic field-modifying structure includes:

a means for correlating the measured value of the odd harmonic component with a spatial misalignment of the magnetic field-modifying structure respective to the main magnet.

20. The apparatus as set forth in claim 14, wherein the magnetic field-modifying structure includes:

a former slidingly secured in a magnet bore defined by the main magnet, the sliding securing permitting sliding adjustment of an axial position of the former within the magnet bore; and one or more metal elements secured with the former that couple with the at least one even harmonic component of the base magnetic field produced by the main magnet.

21. The apparatus as set forth in claim 20, wherein the one or more metal elements include:

paired steel rings that couple with the at least one even harmonic component of the magnetic field produced by the main magnet.

* * * * *